(12) United States Patent
Fort et al.

(10) Patent No.: US 7,365,585 B2
(45) Date of Patent: Apr. 29, 2008

(54) APPARATUS AND METHOD FOR CHARGE PUMP SLEW RATE CONTROL

(75) Inventors: Jimmy Fort, Aix-en-Provence (FR); Jean-Michel Daga, Peynier (FR)

(73) Assignee: Atmel Corporation, San Jose, CA (US)

( * ) Notice: Subject to any disclaimer, the term of this patent is extended or adjusted under 35 U.S.C. 154(b) by 65 days.

(21) Appl. No.: 11/501,798

(22) Filed: Aug. 9, 2006

(65) Prior Publication Data

US 2008/0036516 A1 Feb. 14, 2008

(51) Int. Cl.
*H03K 5/12* (2006.01)

(52) U.S. Cl. .................. 327/170; 327/80; 327/387; 327/540; 326/29; 326/31

(58) Field of Classification Search ............ None
See application file for complete search history.

(56) References Cited

U.S. PATENT DOCUMENTS

| | | | | |
|---|---|---|---|---|
| 4,685,083 A | | 8/1987 | Leuschner | 365/185.07 |
| 5,359,552 A | * | 10/1994 | Dhong et al. | 365/189.09 |
| 5,596,532 A | | 1/1997 | Cernea et al. | 365/185.18 |
| 5,638,007 A | | 6/1997 | Sabin | 326/27 |
| 5,693,570 A | | 12/1997 | Cernea et al. | 438/107 |
| 5,742,193 A | | 4/1998 | Colli et al. | 327/170 |
| 5,768,208 A | | 6/1998 | Bruwer et al. | 365/228 |
| 5,818,766 A | | 10/1998 | Song | 365/189.11 |
| 5,828,245 A | * | 10/1998 | Brambilla et al. | 327/108 |
| 5,939,909 A | | 8/1999 | Callahan, Jr. | 327/108 |
| 5,949,259 A | | 9/1999 | Garcia | 327/111 |
| 6,127,880 A | | 10/2000 | Holst et al. | 327/531 |
| 6,154,101 A | | 11/2000 | Zou et al. | 331/78 |
| 6,388,505 B1 | | 5/2002 | Ribellino et al. | 327/536 |
| 6,483,377 B2 | | 11/2002 | White et al. | 327/536 |
| 6,492,686 B1 | | 12/2002 | Pappert et al. | 257/355 |
| 6,646,415 B1 | | 11/2003 | Nebrigic et al. | 320/107 |
| 6,788,608 B2 | | 9/2004 | Tran et al. | 365/226 |
| 6,801,080 B1 | | 10/2004 | Arcus | 327/563 |
| 6,819,163 B1 | | 11/2004 | Gregoire, Jr. | 327/536 |
| 6,836,179 B2 | | 12/2004 | Mizuno et al. | 327/544 |
| 6,859,391 B1 | | 2/2005 | Combe et al. | 365/185.05 |
| 6,914,476 B2 | * | 7/2005 | Ingino, Jr. | 327/540 |

(Continued)

OTHER PUBLICATIONS

Horace G. Jackson et al. "Analysis and Design of Digital Integrated Circuits: In Deep Submicron Technology. Thid Edition. Semiconductor Memory Design" (2004) 359-398.

(Continued)

*Primary Examiner*—N. Drew Richards
*Assistant Examiner*—An T. Luu
(74) *Attorney, Agent, or Firm*—Schwegman, Lundberg & Woessner, P.A.

(57) ABSTRACT

An apparatus and method for improving memory cell reliability is disclosed. The slew rate is reduced in an applied voltage signal used to program a memory cell when Fowler-Nordheim (FN) tunneling injection is detected. The applied programming signal is provided by a charge pump that is preferably a regulated charge pump. The charge pump is selectively controlled by a slew rate control circuit when FN tunneling injection is detected by a voltage level detection circuit at a predetermined threshold voltage level.

29 Claims, 8 Drawing Sheets

U.S. PATENT DOCUMENTS

| | | |
|---|---|---|
| 6,992,934 B1 | 1/2006 | Sarin et al. ............ 365/185.23 |
| 6,992,937 B2 | 1/2006 | Tran et al. ................... 365/200 |
| 6,998,891 B2 | 2/2006 | Hsu et al. ................... 327/157 |
| 7,015,721 B2 | 3/2006 | Nguyen et al. ............... 326/83 |
| 7,035,151 B2 | 4/2006 | Tran et al. ................... 365/200 |
| 7,049,872 B2 | 5/2006 | Diorio et al. ................ 327/276 |
| 7,061,295 B2 | 6/2006 | Saiki et al. .................. 327/295 |
| 7,250,810 B1* | 7/2007 | Tsen et al. ................... 327/536 |
| 2004/0251955 A1 | 12/2004 | Neidorff ..................... 327/536 |
| 2005/0134244 A1* | 6/2005 | Sanzo et al. ................. 323/283 |
| 2005/0219903 A1 | 10/2005 | Daga ..................... 365/185.18 |
| 2006/0123280 A1 | 6/2006 | Tran et al. ................... 714/718 |

OTHER PUBLICATIONS

P. Canet et al. "Improvement of EEPROM cell reliability by optimization of signal programming." Journal of Non-Crystalline Solids 280 (2001) 116-121. www.elsevier.com/locate/jnoncrysol.

\* cited by examiner

APPARATUS AND METHOD FOR CHARGE PUMP SLEW RATE CONTROL

FIELD OF INVENTION

The present invention relates to an apparatus and method for adaptively controlling slew rates in memory devices using a regulated charge pump. In particular, the present invention relates to improving reliability and the lifespan of memory devices by selectively controlling the applied voltages and waveforms to a memory device during programming.

BACKGROUND

A memory device, such as non-volatile memory, is comprised of a plurality of memory cells. FIG. 1 is an example of a conventional memory cell 100. Memory cell 100 includes a control gate 102 in proximity to an oxide layer 104, and a floating gate 106. Fowler-Nordheim (FN) tunneling, also known as field emission, is a process used for programming memory cell 100. In FN tunneling, a high voltage level is applied to the control gate 102 via word line 108. A charge pump may be used to provide the high voltage levels to control gate 102, although any circuit that provides high voltage levels can be used, as desired.

Once the applied voltage level to control gate 102 passes a certain threshold voltage level, FN tunneling injection begins as current 113 flows from the bit line 110 through drain 112 to source 114. As current 113 flows through the floating gate 106, the drain 112 and source 114 are grounded. Concurrently, the floating gate 106 becomes negatively charged as electrons are injected and trapped in the layer. The negatively charged floating gate 106 may be interpreted as binary value 0 or 1 depending on the implementation, as desired. Since memory cell 100 is non-volatile, the cell retains its programmed state even when the applied voltage level is removed.

Memory cell reliability and the lifespan of a memory device is dependent on the high voltages and waveforms applied to the cell 100 during FN programming, in particular during FN tunneling injection. An attribute of an applied signal waveform is its slew rate. The slew rate is the maximum rate of change of a voltage signal, described by the relationship in Equation (1) as follows:

$$SlewRate = \max\left(\frac{dV}{dt}\right). \quad \text{Equation}(1)$$

Therefore, the slew rate is the highest value derivative, or slope, of a signal waveform.

FIG. 2 illustrates an example of a conventional signal waveform 200 used for programming memory devices. From voltage level $V_{dd}$ 204 to $V_{max}$ 208, signal 200 has a constant slew rate 202. The voltage level $V_{dd}$ 204 is the power supply voltage. The voltage level $V_{max}$ 208 is a high voltage level required to change the state of memory cell 100 in FN programming. The voltage level $V_{threshold}$ 206 is a voltage level that triggers the initiation of FN tunneling injection and where long-term reliability of a memory cell may be compromised. The slew rate 202 of the prior art may result in unnecessary degradation of memory cells. Therefore, a need exits for improving memory cell reliability and lifespan.

SUMMARY

An apparatus and method for improving memory cell reliability is disclosed. The slew rate is reduced in an applied voltage signal used to program a memory cell when Fowler-Nordheim (FN) tunneling injection is detected. The applied programming signal is provided by a charge pump that is preferably a regulated charge pump. The charge pump is selectively controlled by a slew rate control circuit when FN tunneling injection is detected by a voltage level detection circuit at a predetermined threshold voltage level.

BRIEF DESCRIPTION OF THE DRAWINGS

A more detailed understanding of the invention may be had from the following description, given by way of example and to be understood in conjunction with the accompanying drawings wherein.

DETAILED DESCRIPTION OF THE PREFERRED EMBODIMENTS

Figure 1:
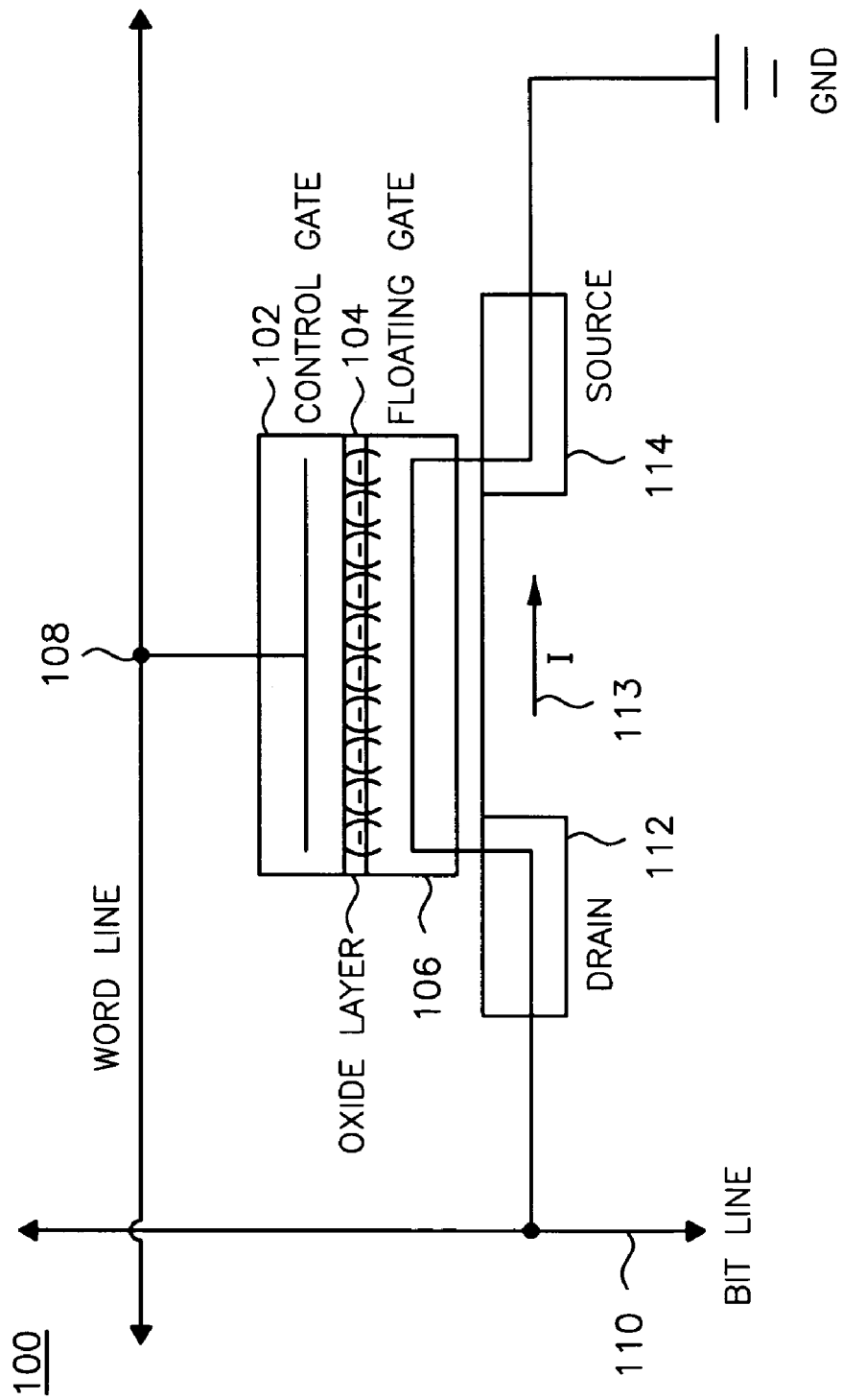
FIG. 1 is an example of a conventional memory cell used in a memory device.
Figure 2:
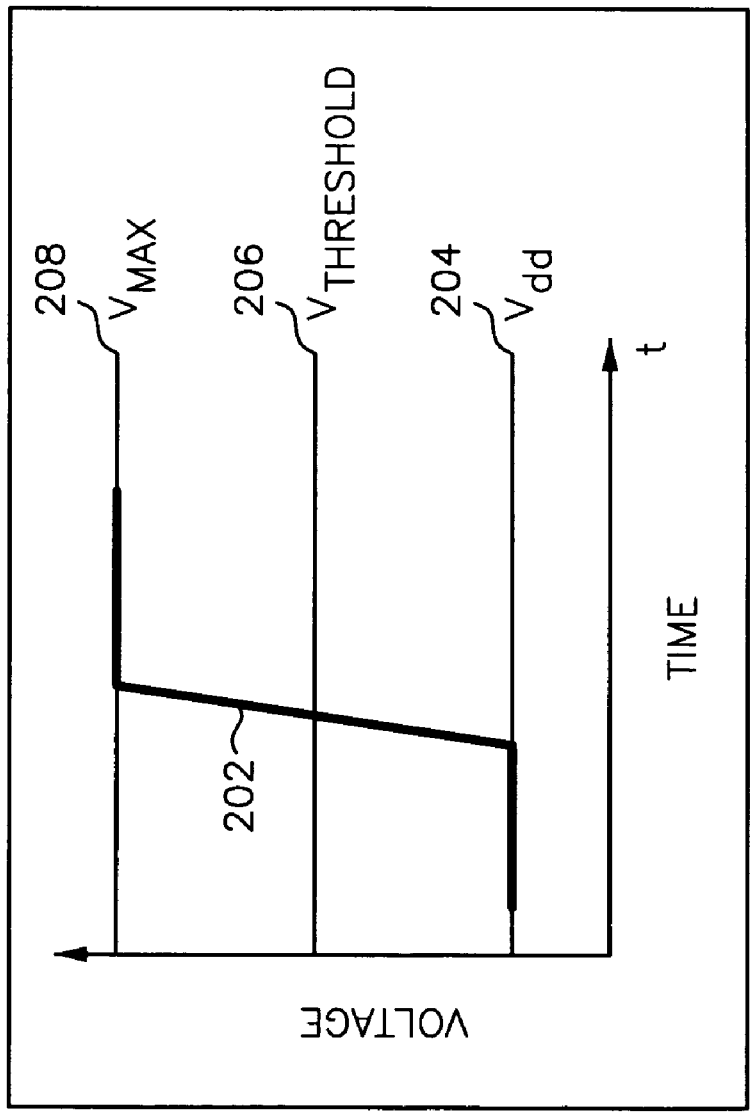
FIG. 2 is an example of a conventional signal waveform used for programming a memory device.

The present invention will be described with reference to the drawing figures wherein like numerals represent like elements throughout. For purposes of describing the present invention, the phrase high voltage level is used. It will be appreciated that the word "high" is a relative term and not necessarily a fixed voltage. Accordingly, the phrase high voltage may be any voltage and may vary, for example, based on the processing technology and/or the material in which the memory cell is implemented. The word "level" may represent a fixed voltage or a voltage range, as desired. Memory cell 100 is used purely as an example. The present invention may be used in any memory device or memory cell. Examples of memory devices include parallel or serial Electrically Erasable Programmable Read-Only Memories (EEPROMs) and Flash memories. In addition, a node and a voltage at a node may be used interchangeably in the description forthcoming.

Figure 3:
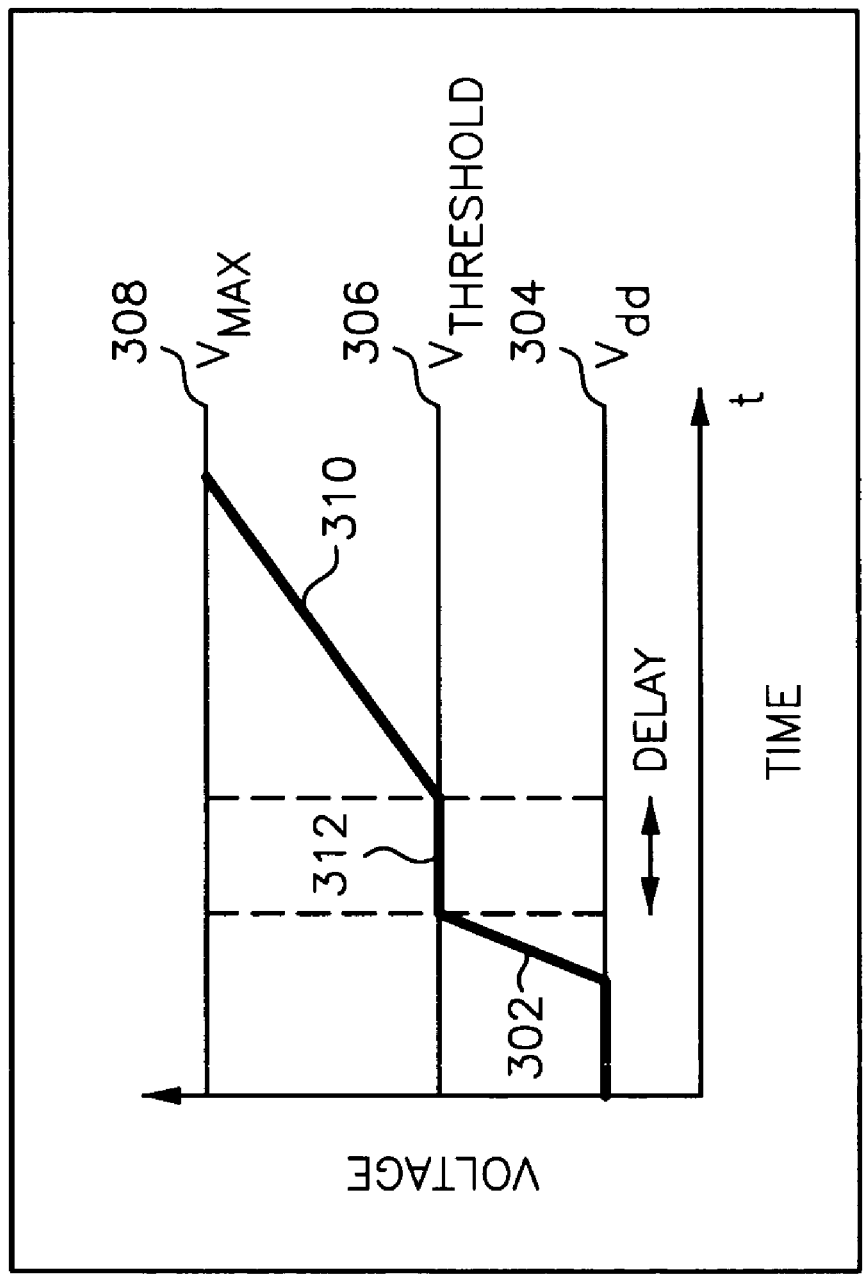
FIG. 3 is an illustration of a signal waveform having an adaptive slew rate used for programming a memory device in accordance with an embodiment of the present invention.

FIG. 3 is an illustration of a signal waveform, such as a message signal, 300 having an adaptive slew rate used for programming a memory device in accordance with an embodiment of the present invention. Signal waveform 300 may be generated by hardware or a computer program tangibly embodied in a computer-readable or machine readable storage medium containing a set of instructions for execution by a processor or a general purpose computer. From voltage level $V_{dd}$ 304 to $V_{threshold}$ 306, a first slew rate 302 is provided for programming memory cell 100 in this voltage range. $V_{dd}$ 304 may be a supply voltage level of 1.8 to 5.5 volts or any other voltage level, as desired. Subsequent to a delay period 312, a second slew rate 310 is utilized for the time period that the voltage increases from voltage range $V_{threshold}$ 306 to $V_{max}$ 308. The second slew rate 310 has a lower value than the first slew rate thereby reducing the negative effects that Fowler-Nordheim (FN) tunneling injection may have on a memory cell. Since the slew rate 310 is less than slew rate 302, an improved transition to $V_{max}$ 308 is provided and the injected tunneling current is limited thereby improving cell reliability. Memory cell reliability is improved since the reduced slew rate 310 reduces the maximum electric field applied to the oxide layer 104 during programming which reduces degradation of the oxide layer 104 and thereby improves long-term reliability and endurance of a memory cell. In addition, reliability is improved without any costly process changes.

Figure 4:
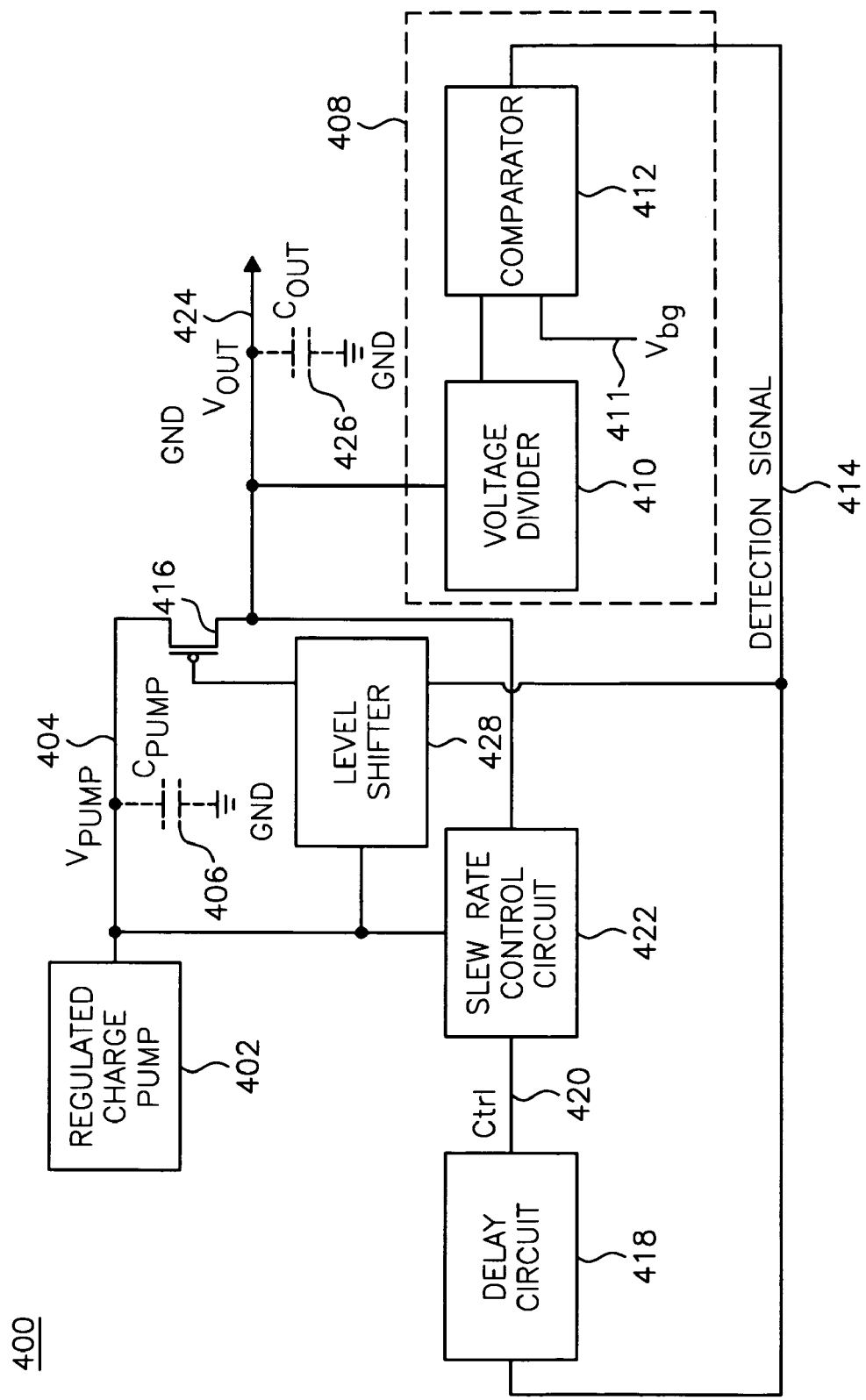
FIG. 4 is an illustration of a regulated charge pump including slew rate control circuitry in accordance with another embodiment of the present invention.

FIG. 4 is an illustration of a regulated charge pump including slew rate control circuitry for providing signal waveform 300 in accordance with another embodiment of the present invention. In circuit 400, regulated charge pump 402 drives a voltage level $V_{pump}$ at charge pump output node 404. A load capacitance $C_{pump}$ 406 may exist at the charge pump output node 404 which is coupled to a p-type metal-oxide semiconductor (PMOS) transistor 416. Although a PMOS transistor is used in the present embodiment, any type of switch may be used. PMOS transistor 416 provides switching between regulated charge pump 402 and slew rate control circuit 422 for driving output voltage level $V_{out}$ at node 424. A load capacitance $C_{out}$ 426 may exist at the output node 424. From voltage level $V_{dd}$ 304 to $V_{threshold}$ 306, PMOS transistor 416 is ON and $V_{out}$ at node 424 is driven by regulated charge pump 402 and follows $V_{pump}$ at node 404 providing the first slew rate 302. From $V_{threshold}$ 306 to $V_{max}$ 308, PMOS transistor 416 is turned OFF and $V_{out}$ at node 424 is driven by slew rate control circuit 422 providing the second slew rate 310.

PMOS transistor 416 is controlled by threshold voltage detection circuit 408, which comprises a voltage divider 410 coupled to a comparator 412, and level shifter 428. The comparator 412 outputs a detection signal at node 414. The output node 414 is coupled to level shifter 428 and delay circuit 418. Voltage level $V_{bg}$ applied to node 411 is the band-gap reference voltage level, which may be used to define $V_{threshold}$ 306. The band-gap reference $V_{bg}$ may be dependent on the materials used to configure a memory cell.

Figure 5:
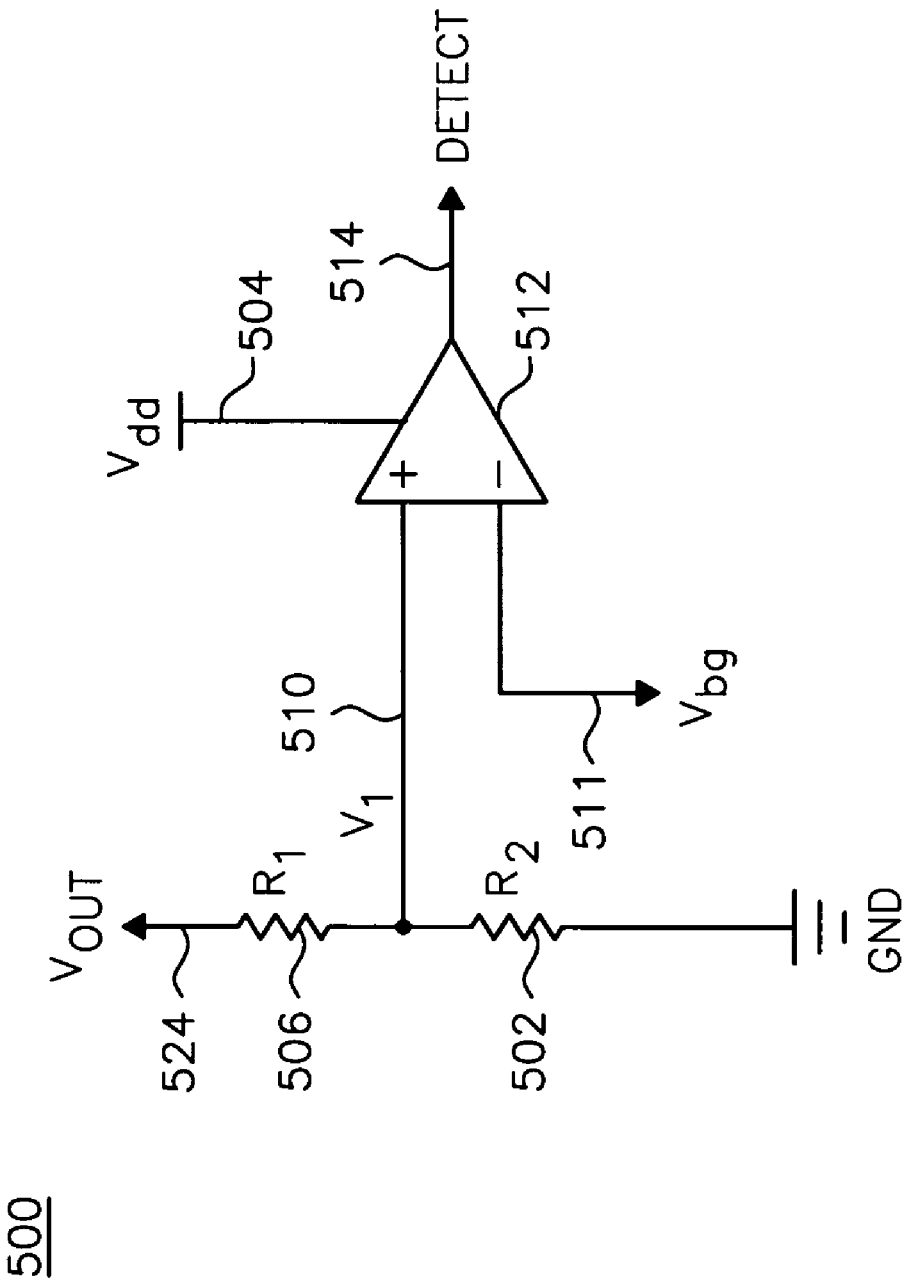
FIG. 5 is an illustration of a threshold detection circuit in accordance with another embodiment of the present invention.

FIG. 5 is an illustration of a threshold voltage detection circuit 500. Resistor $R_1$ 506 is coupled between nodes 524 and 510. Resistor $R_2$ 502 is coupled between nodes 510 and ground. Node 510 is coupled to the non-inverting terminal of operational amplifier (OP-AMP) 512. The inverting terminal of OP-AMP 512 is coupled to the node 511 which provides the band-gap reference voltage level $V_{bg}$. $V_{dd}$ at node 504 provides power to OP-AMP 512. The relationship between $V_{threshold}$ 306, $R_1$ 506, $R_2$ 502, and $V_{bg}$ is given by Equation (2) as follows:

$$V_{threshold} = \frac{(R_1 + R_2)}{R_2} \cdot V_{bg}. \quad \text{Equation(2)}$$

The relationship between $V_{out}$ at node 524, voltage level $V_1$ at node 510, $R_1$ 506, and $R_2$ 502 is given by Equation (3) as follows:

$$V_1 = \frac{R_2}{R_1 + R_2} \cdot V_{out}. \quad \text{Equation(3)}$$

When $V_1$ 510 is equal to band-gap voltage level $V_{bg}$ 511, i.e. $V_{out}$ at node 524 is equal to $V_{threshold}$ 306, comparator 512 switches and a detection signal at node 514 is generated.

Referring back to FIG. 4, once $V_{threshold}$ level 306 is detected by threshold voltage detection circuit 408 at output node 424, the detection signal at node 414 is generated and communicated to level shifter 428. The detection signal at node 414 will typically be at $V_{dd}$. The level shifter 428 may be needed to raise the detection signal level from $V_{dd}$ to $V_{pump}$ in order to properly cutoff PMOS transistor 416. When voltage level $V_{pump}$ is provided to the gate of PMOS transistor 416 by level shifter 428, the transistor is turned OFF disconnecting $V_{out}$ node 424 from $V_{pump}$ node 404. At this point $V_{out}$ at node 424 will be driven by slew rate control circuit 422 which provides the second slew rate 310 and then maintains $V_{out}$ at $V_{max}$ 308. Prior to enabling the slew rate control circuit 422, a delay circuit 418 may be used.

Figure 6:
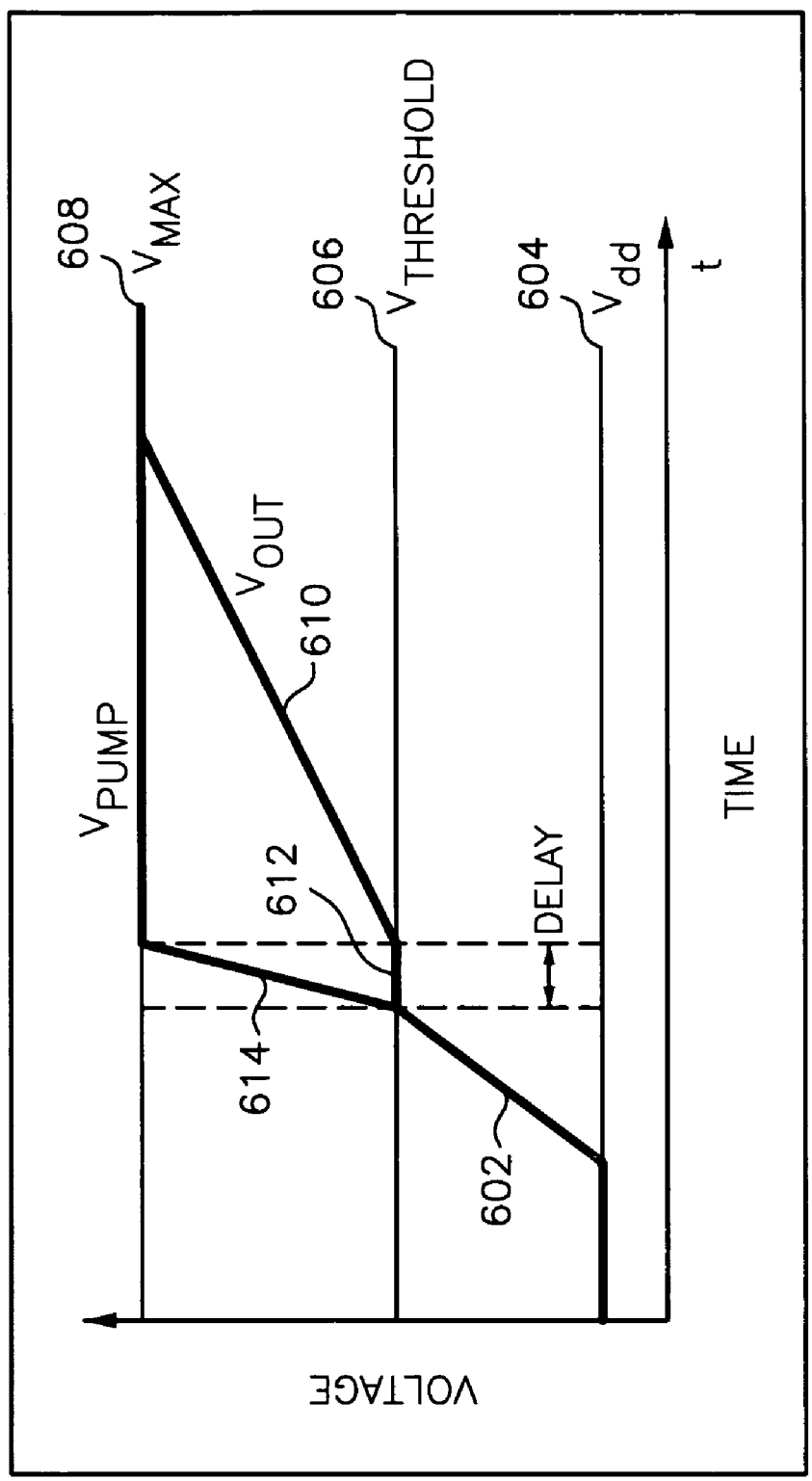
FIG. 6 is an illustration of the output of a regulated charge pump versus the output of an applied voltage signal used for programming a memory device in accordance with another embodiment of the present invention.

FIG. 6 is an illustration 600 of the relationship between $V_{out}$ at node 424 and $V_{pump}$ at node 404. From voltage level $V_{dd}$ 604 to $V_{threshold}$ 606, $V_{out}$ follows $V_{pump}$ at a first slew rate 602. As stated above, at $V_{threshold}$ 606 node 424 is disconnected from node 404 and the delay circuit 418 provides a delay period 612. Delay period 612 allows $V_{pump}$ at node 404 to rise to $V_{max}$ 608 at a second slew rate 614. The second slew rate 614 is a result of a change in the equivalent capacitance seen at the output of the regulated charge pump 402 when PMOS switch 416 is disconnected. The delay period 612 may be determined using values for $C_{pump}$ 406, $V_{max}$ 308, $V_{theshold}$ 306, and $I_{pump}$ by Equation (4) as follows:

$$\text{Delay} = \frac{C_{pump} \cdot (V_{max} - V_{threshold})}{I_{pump}}. \quad \text{Equation(4)}$$

In Equation (4), $I_{pump}$ is the charge pump current at node 404.

During the delay period 612, $V_{out}$ at node 424 remains stable at a constant value and is not driven by either the regulated charge pump 402 or the slew rate control circuit 422. After the delay period 612, delay circuit 418 provides a control signal 420 to enable slew rate control circuit 422 at which point $V_{out}$ at node 424 is driven by slew rate control circuit 422 at a third slew rate 610, which is less than the first slew rate 602 and second slew rate 614, until $V_{max}$ 608 is reached.

Figure 7:
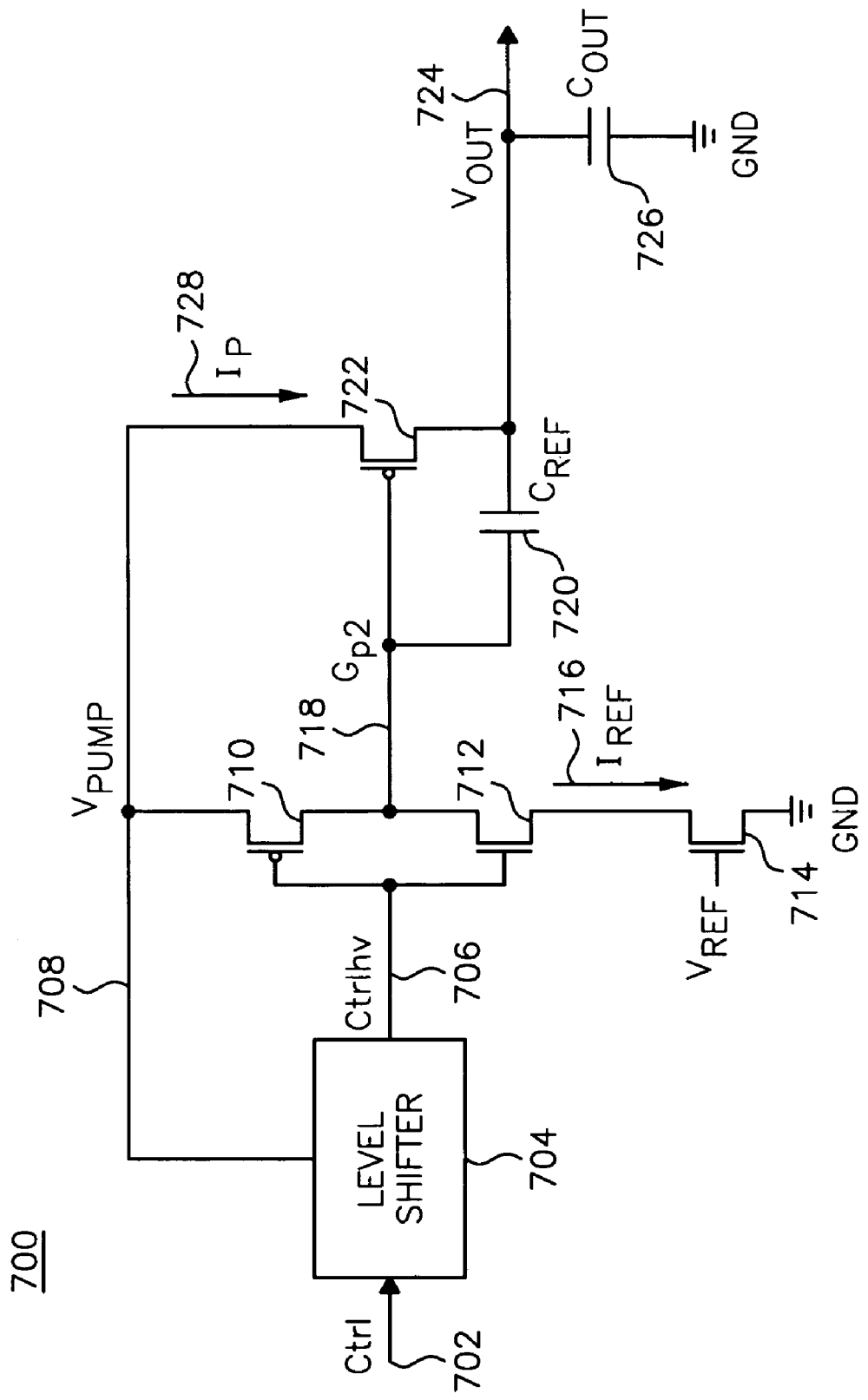
FIG. 7 is an illustration of a slew rate control circuit in accordance with another embodiment of the present invention.

FIG. 7 is an illustration of a slew rate control circuit 700 in accordance with another embodiment of the present invention. Control signal (Ctrl) 702 is provided to level shifter 704 which raises the level of control signal 702 from $V_{dd}$ 304, or high, to $V_{pump}$ at node 708 resulting in control high voltage signal (Ctrlhv) at node 706. If the Ctrl 702 is low, such as at a ground value, then Ctrlhv is low and PMOS transistor 710 is ON. Correspondingly, when Ctrlhv is low, n-type metal-oxide semiconductor (NMOS) transistor 712 is OFF. Since the gate of PMOS transistor 722, which acts as an amplifier, is driven by $V_{pump}$ at node 708 via PMOS transistor 710, PMOS transistor 722 is OFF resulting in no connection between nodes 708 and 724 when Ctrlhv is low. In this case, $V_{out}$ at node 424 is driven by regulated charge pump 402.

When Ctrl signal 702 is set to high, or $V_{dd}$, Ctrlhv 706 is raised from $V_{dd}$ to $V_{pump}$ at node 708 by level shifter 704. When Ctrlhv 706 is set to $V_{pump}$, PMOS transistor 710 is OFF and NMOS transistor 712 is ON resulting in current $I_{ref}$ 716 which is controlled by reference voltage level $V_{ref}$ to the gate of NMOS transistor 714. When NMOS transistor 712 is ON, the voltage level of node 718 gate voltage $G_{p2}$ decreases turning PMOS transistor 722 ON. When PMOS transistor 722 starts conducting current $I_p$ 728, $V_{out}$ at node 724 begins to rise at a certain slew rate. Due to the coupling feedback capacitance $C_{ref}$ 720 between nodes 718 and 724, a positive variation from the output is provided to gate voltage $G_{p2}$ which counteracts the negative variation on to $G_{p2}$ due to $I_{ref}$ 716. These two counteracting effects on the voltage $G_{p2}$ at node 718 provided by the feedback path on PMOS transistor 722 results in a stable, balanced, equilibrium node voltage at 718.

Stilling referring to FIG. 7, since the gate voltage $G_{p2}$ is held constant, the relationship between the pump current $I_p$ 728 and reference current $I_{ref}$ 716 is given by Equation (5) as follows:

$$I_p = I_{ref} \frac{C_{out} + C_{ref}}{C_{ref}}. \qquad \text{Equation(5)}$$

The slew rate of the output voltage $V_{out}$ at node 724 is given by Equation (6) as follows:

$$SlewRate = \frac{I_p}{C_{out} + C_{ref}}. \qquad \text{Equation(6)}$$

Substituting Equation (5) into Equation (6) for $I_p$ 728, Equation (7) is given as follows:

$$SlewRate = \frac{I_{ref}}{C_{ref}}. \qquad \text{Equation(7)}$$

Equation (7) shows that the slew rate of $V_{out}$ at node 724 is independent of the output capacitance $C_{out}$ 726 and the slew rate may be adjusted using different values for $I_{ref}$ 716 and $C_{ref}$ 720, as desired. $I_{ref}$ 716 may be adjusted by changing the level of $V_{ref}$. It is favorable to have the slew rate independent of $C_{out}$ 726, since it provides a more controlled and stable slew rate. Without the slew rate control circuit 422, at high voltages the slew rate of $V_{out}$ at node 424 would be highly dependent on the $C_{pump}$ capacitance 406 and the current driving ability of regulated charge pump 402. As a consequence, large variations of $C_{pump}$ 406 can result in slew rate variations, which are undesirable when programming memory, especially during FN tunneling injection. For instance, $C_{pump}$ 406 may vary when programming a memory device using a plurality of bits in parallel since the equivalent capacitance, or the total capacitive load, seen by $C_{pump}$ 406 may vary. Table 1 shows the independence on the slew rate by varying values of $C_{out}$ 726 using circuits 400 and 700 of the present invention.

TABLE 1

| $C_{out}$ (in picofarads pF) | Slew Rate (in Volts per microsecond V/µs) |
| --- | --- |
| 10 | 0.48 |
| 20 | 0.48 |
| 40 | 0.47 |
| 60 | 0.47 |
| 80 | 0.46 |
| 100 | 0.455 |

Figure 8:
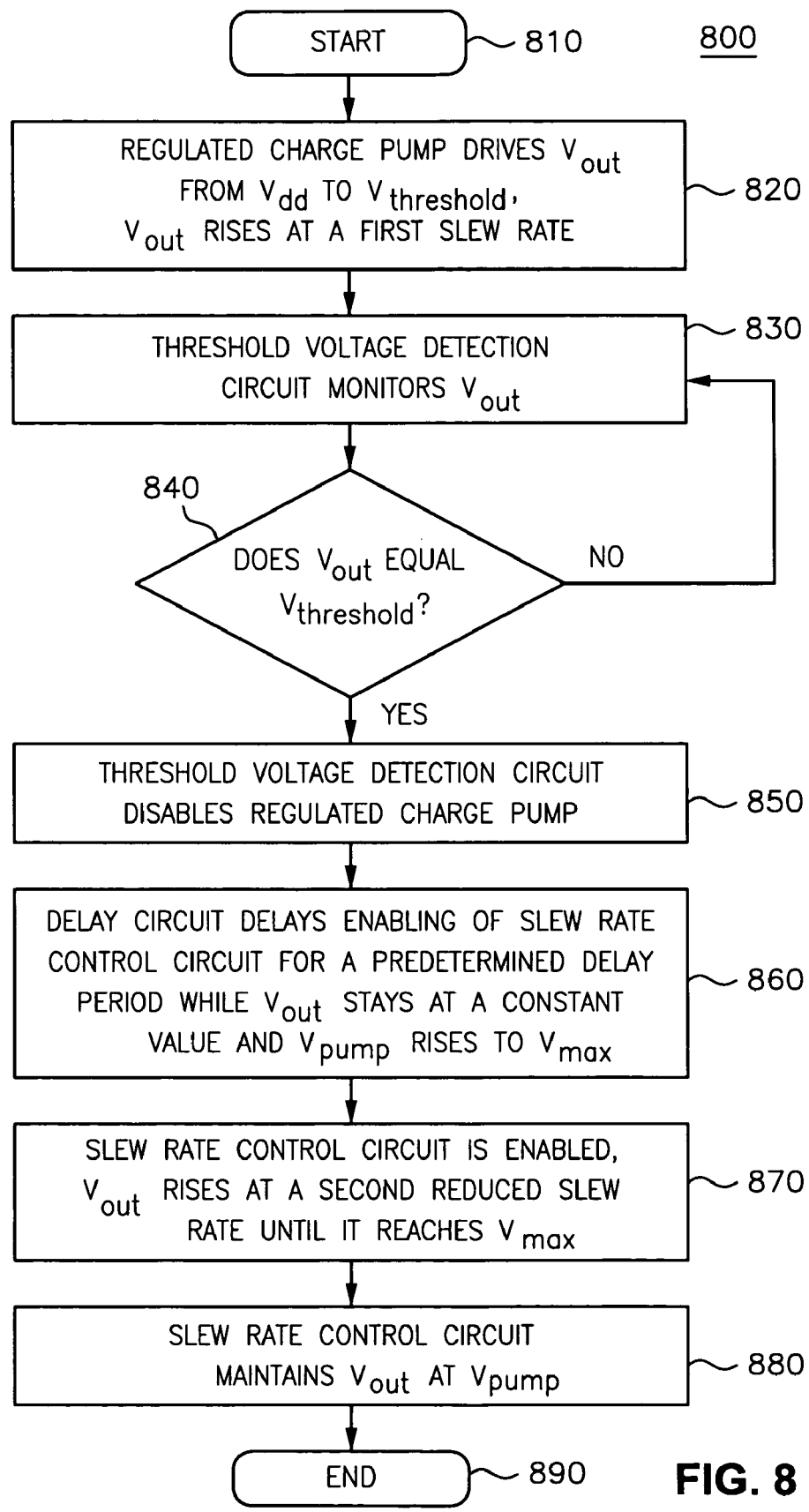
FIG. 8 is an illustration of a flow chart of a method for providing improved memory cell reliability during programming of a memory device in accordance with another embodiment of the present invention.

FIG. 8 is an illustration of a flow chart 800 of a method for providing the controlled slew rate 300 comprising of steps 810 to 890. In step 820, regulated charge pump 402 drives $V_{out}$ at node 424 from $V_{dd}$ 304 to $V_{threshold}$ 306 at a first slew rate 302. In steps 830 and 840, threshold voltage detection circuit 408 monitors $V_{out}$ 424 until it reaches $V_{threshold}$ level 306. In step 850, threshold voltage detection circuit 408 disables regulated charge pump 402 when $V_{out}$ 424 reaches $V_{threshold}$ level 306 by communicating a detection signal on node 414 to level shifter 428 which turns OFF PMOS switch 416. In step 860, delay circuit 418 delays enabling of the slew rate control circuit 422 for a predetermined delay period 312 while $V_{out}$ 424 stays at a constant value and $V_{pump}$ at node 404 rises to $V_{max}$ 308. In step 870, after delay period 312, slew rate control circuit 422 is enabled and $V_{out}$ at node 424 rises at a second reduced slew rate 310 until it reaches $V_{max}$ 308. In step 880, slew rate control circuit 422 maintains $V_{out}$ at node 424 at $V_{pump}$, which is substantially equal to $V_{max}$ 308 at this point.

Although the features and elements of the present invention are described in the preferred embodiments in particular combinations, each feature or element can be used alone without the other features and elements of the preferred embodiments or in various combinations with or without other features and elements of the present invention. The present invention may be implemented in a computer program tangibly embodied in a computer-readable storage medium for execution by a processor or a general purpose computer for use with or by any non-volatile memory device. Suitable processors include, by way of example, both general and special purpose processors. Typically, a processor will receive instructions and data from a ROM, a random access memory (RAM), and/or a storage device. Storage devices suitable for embodying computer program instructions and data include all forms of non-volatile memory, including by way of example semiconductor memory devices, magnetic media such as internal hard disks and removable disks, magneto-optical media, and optical media such as CD-ROM disks and digital versatile disks (DVDs). Types of hardware components or processors which may be used by or in conjunction with the present invention include Application Specific Integrated Circuits (ASICs), Field Programmable Gate Arrays (FPGAs), microprocessors, or any integrated circuit.

What is claimed is:

1. A system for providing an adaptive slew rate voltage signal to a memory cell, the system comprising:

a charge pump coupled to a switch, the charge pump having a charge pump current, a charge pump load capacitance, and a charge pump voltage level, wherein the charge pump drives an output node having an output node voltage level at a first slew rate for a first voltage range;

a threshold voltage detection circuit coupled to a level shifter, a delay circuit, and the output node, wherein the threshold voltage detection circuit comprises a voltage divider circuit coupled to a comparator circuit;

a slew rate control circuit coupled to the delay circuit, the charge pump, and the output node; and wherein the threshold voltage detection circuit generates a detection signal when the output node voltage level reaches a predetermined threshold voltage level, the detection signal communicated to the level shifter coupled to the switch to disable the charge pump and enable the slew rate control circuit to drive the output node voltage level at a second slew rate less than the first slew rate for a second voltage range.

2. The system of claim 1 wherein the delay circuit delays the enabling of the slew rate control circuit for a predetermined delay period.

3. The system of claim 2 wherein the predetermined delay period is determined by the charge pump current and the charge pump load capacitance.

4. The system of claim 2 wherein the output node voltage level is constant during the predetermined delay period.

5. The system of claim 2 wherein the slew rate control circuit is enabled subsequent to the predetermined delay period.

6. The system of claim 2 wherein the charge pump voltage level rises to a high voltage level during the predetermined delay period.

7. The system of claim 1 wherein the predetermined threshold voltage level is a band-gap voltage level.

8. The system of claim 1 wherein the predetermined threshold voltage level is a voltage level which triggers the initiation of Fowler-Nordheim (FN) tunneling injection.

9. The system of claim 1 wherein the comparator circuit generates the detection signal when the output node voltage level equals the predetermined threshold voltage level.

10. The system of claim 1 wherein the first voltage range is between a supply voltage level to the predetermined threshold voltage level.

11. The system of claim 1 wherein the second voltage range is between the predetermined threshold voltage level to a high voltage level.

12. The system of claim 1 wherein the slew rate control circuit comprises a control signal level shifter.

13. The system of claim 1 further comprising the output node having an output load capacitance, wherein the second slew rate is independent of the output load capacitance.

14. The system of claim 1 wherein the memory cell is an Electrically Erasable Programmable Read-Only Memory (EEPROM) cell.

15. The system of claim 1 wherein the memory cell is a Flash memory cell.

16. The system of claim 1 wherein the output node voltage level is used to program the memory cell.

17. The system of claim 1 wherein the charge pump is a regulated charge pump.

18. A method for providing an adaptive slew rate voltage signal to a memory cell, the method comprising:

driving an output node having an output node voltage level at a first slew rate for a first voltage range;

detecting when the output node voltage level reaches a predetermined threshold voltage level;

delaying driving of the output node voltage level for a predetermined delay period; and driving the output node voltage level at a second slew rate less than the first slew rate for a second voltage range subsequent to the predetermined delay period.

19. The method of claim 18 wherein the output node voltage level is constant during the predetermined delay period.

20. The method of claim 18 wherein the predetermined threshold voltage level is a band-gap voltage level.

21. The method of claim 18 wherein the predetermined threshold voltage level is a voltage level which triggers the initiation of Fowler-Nordheim (FN) tunneling injection.

22. The method of claim 18 wherein the first voltage range is between a supply voltage level to the predetermined threshold voltage level.

23. The method of claim 18 wherein the second voltage range is between the predetermined threshold voltage level to a high voltage level.

24. The method of claim 23 wherein the output node voltage level is maintained at the high voltage level subsequent to driving the output node voltage at the second slew rate.

25. The method of claim 18 further comprising the output node having an output load capacitance, wherein the second slew rate is independent of the output load capacitance.

26. The method of claim 18 wherein the output node voltage level is used to program the memory cell.

27. A machine readable storage medium having a stored set of instructions executable by a machine for providing an adaptive slew rate voltage signal to a memory cell, the instructions comprising:

instructions to provide an output node voltage level at a first slew rate for a first voltage range, wherein the first voltage range is between a supply voltage level to a predetermined threshold voltage level;

instructions to detect when the output node voltage level reaches the predetermined threshold voltage level; and instructions to provide the output node voltage level at a second slew rate less than the first slew rate for a second voltage range subsequent to a predetermined delay period, wherein the second voltage range is between the predetermined threshold voltage level to a high voltage level.

28. The machine readable storage medium of claim 27 wherein the predetermined threshold voltage level is a band-gap voltage level.

29. The machine readable storage medium of claim 27 wherein the predetermined threshold voltage level is a voltage level which triggers the initiation of Fowler-Nordheim (FN) tunneling injection.

* * * * *